(12) United States Patent
Steinhauer

(10) Patent No.: US 7,027,191 B1
(45) Date of Patent: Apr. 11, 2006

(54) EXPANDED COLOR SPACE

(75) Inventor: Jeffrey Steinhauer, Rehovot (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/623,401

(22) PCT Filed: Mar. 2, 1998

(86) PCT No.: PCT/IL98/00101

§ 371 (c)(1),
(2), (4) Date: Oct. 30, 2000

(87) PCT Pub. No.: WO99/45433

PCT Pub. Date: Sep. 10, 1999

(51) Int. Cl.
*H04N 1/40* (2006.01)

(52) U.S. Cl. ..................... 358/3.2; 358/3.06

(58) Field of Classification Search ............... 358/1.9, 358/534–536, 3.06–3.2
See application file for complete search history.

(56) References Cited

U.S. PATENT DOCUMENTS 5,734,800 A * 3/1998 Herbert et al. ............... 358/1.9
5,892,891 A * 4/1999 Dalal et al. .................. 358/1.9

FOREIGN PATENT DOCUMENTS

DE         35 37 008 A      4/1987

* cited by examiner

*Primary Examiner*—Thomas D. Lee
*Assistant Examiner*—Stephen Brinich

(57) ABSTRACT

A process for color printing an image with angled half tone screens and a colorant set that includes Cyan, Magenta, Yellow and Black colorants and at least one other colorant having a hue angle intermediate the hue angles of Cyan and Magenta.

27 Claims, 3 Drawing Sheets

US 7,027,191 B1

EXPANDED COLOR SPACE

RELATED APPLICATION

The present application is a US national stage application of PCT/IL98/00101, filed 2 Mar. 1998.

FIELD OF THE INVENTION

The invention relates to color spaces used in color printing and in particular to the choice of colorants employed in a color space employing a multiplicity of colorants.

BACKGROUND OF THE INVENTION

Color imaging systems are based on the fact that a small number of colors can be mixed in varying proportions to provide a very large range, or gamut of colors. The materials, dyes, inks, phosphors etc. used to provide the different colors of a color imaging system are commonly called colorants. Most common color imaging systems are based on three colorants. An appropriately chosen set of three colorants can provide a large fraction of the all the colors perceived by the visual system. For example, all the colors seen on TV or computer CRT displays are produced by stimulating the eye with light emitted by Red, Green and Blue phosphors. Mixing Cyan, Magenta and Yellow inks provides the colors on most of the printed pages.

However, while three colorants can provide a large gamut of color, imperfections in the colorants used in printing systems limit the gamut achieved with printing systems using three colorants. As a result, color imaging systems using more than three colorants are used in many applications. In particular, for applications requiring very high quality printing, color printing systems using five or even more colorants including a neutral black colorant have been developed and are used. Neutral black in color printing is used to control the saturation and luminance of colors at points in a printed image. White is provided by the white of the paper on which the images are printed. The amount of white at a point in an image is reduced by the amount of black printed at the point. Black is printed as a separate "color" because combinations of the other colorants generally do not provide a sufficiently "black" black. Common printing systems therefore use four colorants, Cyan, Magenta, Yellow plus Black.

In color printing, each of the colorants used to produce color, i.e. each colored ink, is applied to paper as a raster, conventionally called a screen, of very small colored ink dots. The dots vary in size and/or in spacing. In conventional screens, called "angled halftone screens", the dots are arrayed in a regular pattern of rows with the spacing between dots constant and dot size varying. With the introduction of computers into the printing industry, screens called stochastic screens came into use. In stochastic screens dot spacing is varied "pseudo-randomly" and dot size is either constant or also varied pseudo-randomly. At any point on a printed paper the fraction of the surface of the paper that is covered with the color of a particular ink is proportional to the size or number of the dots of the ink at the point. The relative amounts of each colorant at a point on the paper, and thereby the perceived color of the point, is therefore controlled by the size and/or the number of the dots of each of the colorants at the point.

In conventional printing with angled halftone screens, if the screens of the various colorants are applied so that the rows of dots of different screens are parallel, the slightest relative misalignment of the rows from parallel leads to disturbing patterns in the printed image called moiré patterns. Stochastic screens on the other hand do not have rows of dots or any regular patterns of dots that result in stochastic screens having defined directions. There is no alignment problem with stochastic screens that causes moiré patterns. In stochastic screens moiré patterns are substantially prevented by the randomness of the dot spacing.

In order to reduce or prevent moiré patterns when printing with conventional angled halftone screens, angled halftone screens are printed so that angles (hence, the word "angled" in angled halftone screens) between rows of different angled halftone screens are relatively large. Let the printing angle, hereafter referred to as a "screen angle", of an angled halftone screen printed on a paper be defined as the angle between 0° and 180° that is measured between the horizontal direction of the printed page and the direction of the rows of dots of the angled halftone screen. In a typical Cyan (C), Magenta (M), Yellow (Y) and Black (K) (hereafter referred to as "CMYK") printing process, the Cyan, Magenta and Black angled halftone screens have screen angles of 15°, 75° and 45° respectively and the Yellow angled halftone screen has a screen angle of 90°. This results in C and M being printed with screen angles that are separated by 30° from K and from each other, and with Y printed with a screen angle separated by 15° from the screen angles with which C and M are printed. Y is a "weak" color and does not generally generate moiré patterns as readily as do the strong colorants C,M and K. Y can therefore be printed with a screen angle close to the other colors. (In angled half tone screens where the dots are equally spaced from each other, the screens appear to have parallel rows of dots that are 90° to each other, i.e. the screens are invariant under a 90° rotation. Therefore a screen that has rows at 90° also has rows at 0°, a screen that has rows at 15° also has rows at 105°. Therefore the difference between the angles of a screen at 15° and 75° is not 60°, as might be expected, but 30°.)

Most color printing processes using more than four colorants generally use the standard CMYK set of colorants plus additional colorants. In prior art printing using angled halftone screens, each of the additional colorants is printed with a screen angle that is the same as one of the screen angles with which the C, M or Y colorants is printed. Black is generally the only color printed with a screen angle of 45° and it is established practice to print C and M with screen angles that 30° apart from each other and from black, as in the case of printing with the CMYK colorant set, in order to assure minimum moiré interference between these strong colorants. However, it is known and established practice in prior art that two strong colorants that have adjacent hue angles (as defined in typical chromaticity diagrams in which hue is a function of two color variables) should be printed with very different screen angles in order to prevent moiré patterns. A color printing process using C, M, Y and K plus an additional strong colorant having a hue angle intermediate the hue angles of C and M would cause C and M to be printed with the same or very close screen angles. As a result, in prior art angled half tone printing systems using colorant sets comprising N colorants, hereafter referred to as "N-colorant sets", where N represents the number of colorants used, strong colorants having hue angles between the hue angle of C and M are not used.

For example, a Pantone® Hexachrome™ printing system, which is used with both conventional angled half tone screens and stochastic screens is described in "PANTONE® HEXACHROME™ COLOR SELECTOR", by Pantone Inc., 1995, which is incorporated herein by reference. This system uses colorants K, C, G, M, Y, and O, none of which has a hue angle intermediate the hue angles of C and M. On the other hand, a 7-colorant set for printing with stochastic screens only is described in a brochure entitled "DAVIS INC HiFi Color Project" published in 1993 by DAVIS INC/ Visible Solutions Ltd./Nima Hunter Inc., incorporated herein by reference. This system uses a Violet (V) colorant. Violet has a hue angle intermediate the hue angles of C and M. However, since the DAVIS INC HiFi Color Project system is not intended for use with angled halftone screens, the use of V is not prohibited in this system by prior art practices employed to prevent moiré patterns.

The exclusion of colorants with hue angles intermediate the hue angles of C and M in printing processes using angled halftone screens restricts the gamut of colors available to prior art printing processes using angled halftone screens and more than four colorants. In particular, a large fraction of the colors required in printing applications falls in the color region of chromaticity diagrams lying in the region of the visual gamut between the line connecting C and M and the saturated blue and purple hues. Hues in this color region cannot be produced using prior art N-colorant sets used with angled half tone screens, i.e. the color region is not accessible with these prior art N-colorant sets.

FIG. 1 shows schematically a chromaticity diagram 20 showing the human visual color gamut 22, and portions of visual gamut 22 included in a restricted CMYK gamut 34, and a full CMYK gamut 36, of printed hues provided by a typical CMYK colorant set. Hues in chromaticity diagram 20 are mapped at an arbitrary constant luminance as a function of arbitrary units of commonly used color variables $u^*$ and $v^*$. Details of the definition of color variables $u^*$ and $v^*$ can be found in "THE REPRODUCTION OF COLOUR IN PHOTOGRAPHY, PRINTING AND TELEVISION", by R. W. G. Hunt; Fountain Press, England; Fourth Edition 1987, which is incorporated herein by reference.

Points in chromaticity diagram 20 on a boundary curve 24 and in the area 26 located inside boundary curve 24 represent the hues of the human visual gamut 22. Curve 24 defines the outer boundary of visual color gamut 22 and comprises a curved part 28 and a straight-line part 30. Any hue perceived by the human visual system is represented by a point on or within boundary curve 24, and any point in area 26 or on boundary curve 24 generally represents a hue perceived by the human visual system.

Fully saturated hues are located on boundary curve 24. Portions of boundary curve 24 corresponding to particular saturated hue sensations are labeled with the names of the particular hue sensations. All points on curved part 28 of boundary curve 24 represent monochromatic light stimuli (i.e. light stimuli comprising a single wavelength of light) and all monochromatic light stimuli are represented by points that fall on curved part 28 of boundary curve 24. Points on curved part 28 of boundary curve 24 representing a number of monochromatic light stimuli are shown and are labeled with the wavelength in nanometers, in parentheses, of the light stimuli they represent. Hues represented by points on straight-line part 30 of boundary curve 24 represent fully saturated purples, magentas and mauves. These hues can only be produced by mixing red and blue light stimuli.

The sensation that a light stimulus is neutral is the sensation that the light stimulus is "hueless". The hueless, or neutral colors, are the sensations of shades of gray ranging from black to white. The sensation that a light stimulus is neutral is located inside area 26 at a point 32 that is the origin of coordinates of chromaticity diagram 20. Whether point 32 represents white or a shade of gray is a function of the luminance of the light stimulus represented by point 32 (i.e. the arbitrary constant luminance of chromaticity diagram 20) relative to the luminance of a reference white. In printing, the reference white is generally the white of the paper on which colorants are printed. For an area of a printed image, point 32 represents white if no black is printed in the area. As the fraction of the area printed with black colorant increases, point 32 represent an increasingly darker shade of gray.

Since the amount of white at a point in a printed color image is controlled by the amount of Black printed at the point, the colorant K of the CMYK colorant set (and of all colorant sets using a Black colorant) is located at point 32. Point 32 is labeled W/K to indicate that it represents shades of gray produced by printing black on the white provided by the paper on which the image is printed.

Points labeled C, M and Y in chromaticity diagram 20 represent the hues of colorants C, M and Y respectively. Points labeled (C+Y), (M+Y) and (C+M) represent hues produced by mixing equal amounts of the colorants appearing in the respective parentheses. Restricted gamut 34 is defined by the triangle formed by short dash lines 38 that connect points C, M and Y. Full gamut 36 is defined by the polygon formed by long dash lines 40 connecting points C→(C+M)→M→(M+Y)→Y→(Y+C)→C.

The C, M and Y colorants are subtractive colorants. Each absorbs light having a wavelength in a different restricted band, an "absorption band", of the visual spectrum and transmits light having a wavelength in the rest of the visible spectrum. If the C, M and Y colorants were ideal subtractive colorants, the points (C+M), (M+Y) and (Y+C) would be on the lines connecting points C and M, M and Y, and Y and C, respectively. Restricted and fall CMYK gamuts 34 and 36 respectively would then be congruent. To the extent that the C, M and Y colorants are not ideal subtractive colorants, but are real world colorants, they transmit light where they should not do so and absorb some of the incident light that should be transmitted completely. This causes restricted gamut 34 to shrink. It also results in mixtures of any two of the C, M and Y colorants to be slightly more saturated than would be the case if the colorants were ideal. As a result, mixing equal parts of C and Y does not produce a green hue represented by a point on the line connecting C and Y in chromaticity diagram 20. Mixing equal parts of C and Y produces a more saturated green hue represented by point (C+Y) that is displaced from the line connecting C and Y, in a direction towards boundary curve 24 of visual gamut 22. Similarly, hues (M+Y) and (C+M) are not located on the lines connecting M and Y, and C and M, respectively, but are displaced towards boundary curve 24 of visual gamut 22.

Full CMYK gamut 36 represents the full range of hues that can be produced by the C, M, Y and K colorants. The different hues within full CMYK gamut 36 can be produced at a point in a printed image by printing different relative amounts of C, Y, M and K at the point. Full CMYK gamut 36 cannot be extended to cover a significant color region in the corner of visual gamut 22 near to the saturated blue and purple hues without the use of a colorant having a hue angle intermediate the hue angles of C and M. (Such a colorant would be represented by a point far outside of extended gamut 36 that is located on a line from point 32 that lies between the lines from point 32 to C and M.) Such colorants are excluded in prior art N-colorant sets for printing with angled half tone screens in order to prevent moiré patterns.

In order to expand the gamut of colors available to printing processes using angled half tone screens and more than the basic C, M, Y and K colorants, it would be advantageous to be able to use strong colorants with hue angles intermediate the hue angles of Cyan and Magenta.

SUMMARY OF THE INVENTION

In accordance with one aspect of the present invention N-colorant sets for use with angled half tone screens are provided having at least one colorant, in addition to C, M, Y and K, that has a hue angle intermediate the hue angles of C and M.

It is an object of another aspect of the present invention to provide N-colorant sets for use with angled half tone screens that have a gamut that includes more of the colors most frequently encountered in color printing applications than the gamuts of prior art N-colorant sets of the same N that are used with angled half tone screens.

It is a further object of an aspect of the present invention to provide screen angles for N-colorant sets for use with angled half tone screens where one of the colorants has a hue angle intermediate the hue angles of C and M and wherein the screen angles mitigate moiré patterns.

It is yet a further object of an aspect of the present invention to provide a colorant set wherein N is six that satisfies the objects of aspects of the present invention noted above.

In an N-colorant set, in accordance with a preferred embodiment of the present invention, one of the colorants used is purple or deep violet (V). The gamut of an N-colorant set using V as a colorant, in accordance with a preferred embodiment of the present invention, includes, from experience, more of the colors most frequently needed in printing applications than the gamuts of prior art N-colorant sets. In particular, the gamut of an N-colorant set, in accordance with a preferred embodiment of the present invention, extends into and covers a significant portion of the color region of chromaticity diagrams lying between the line connecting C and M and the saturated blue and purple hues.

Choosing V as a colorant for use with C and M constrains C and M to be printed with the same or close screen angles. This clashes with standard practice and habit, which dictates that C and M be printed with very different screen angles in order to prevent the occurrence of moiré patterns. The inventors of the present invention have realized that C and M can be printed with the same screen angles without producing quality degrading moiré patterns and that therefore V can be used as one of the colorants in an N-colorant set that includes C, M, Y and K.

In an N-colorant set where one of the colorants is black, the gamut of colors that can be printed can be represented on a chromaticity diagram by a polygonal area (hereafter a "polygonal gamut") generally having 2(N-1) vertices. Half the vertices of the polygonal gamut are the points on the chromaticity diagram representing the hues of the non-black colorants used in the printing process. The other half of the vertices represent hues produced by mixing equal amounts of two of the non-black colorants having adjacent hue angles. The neutral color on the chromaticity diagram, which is a shade of gray between white and black, is located toward the center of the polygonal gamut and is controlled by the amount of black colorant printed. The point on the chromaticity diagram representing the neutral color therefore effectively represents the black colorant and hereafter will be referred to as the white/black point.

The polygonal gamut can be divided up into N-1 color regions that together cover all the area of the polygonal gamut. Each of the color regions is a polygon with four vertices. One of the vertices of all the color regions is the black/white point in the chromaticity diagram representing the neutral color. Two of the other vertices, hereafter referred to as "colorant vertices", of each color region are points representing two colorants of the colorant set that have adjacent hue angles. The fourth vertex of each color region represents the hue produced by mixing equal amounts of the colorants located at the colorant vertices of the color region.

Any particular color that can be printed by the N-colorant set is located in one of the N-1 color regions. The particular color can therefore be printed using black and the two colorants at the colorant vertices of the color region in which the particular color is located. At any point in the image therefore, only two colorants and black need be printed. As long as the screen angles of black and these two colorants are very different, preferably with the screen angles spaced 30° apart from each other and 30° from the black screen angle, moiré patterns will be mitigated. The screen angles of the other colorants of the N-colorant set do not substantially affect moiré patterns at the point since they are not printed at the point. The condition required to substantially prevent moiré patterns is that the two colorants located at the colorant vertices of the same color region be printed with very different screen angles. Preferably, an angle of 30° separates the screen angles of the two colorants at the colorant vertices belonging to the same color region. Colorants at the colorant vertices of different color regions can be printed with the same screen angle since they are generally not printed together at the same spot in the image. In particular if C and M belong to different color regions they can be printed with the same screen angles.

In an N-colorant set, in accordance with a preferred embodiment of the present invention, where one of the colorants is black, black is printed with a screen angle of 45°. Let the N-1 colorants of the N-colorant set, other than black, be numbered sequentially with the integers 1 through N-1, beginning from one color and moving clockwise on a chromaticity diagram on which the polygonal gamut of the N-colorant set is represented. Preferably, the odd numbered colorants are printed with a first screen angle and the even numbered colorants are printed with a second screen angle, where the first and second screen angles are different from 45°. Preferably, one of the first and second screen angles is 15° and the other of the first and second screen angles is 75°.

If N-1 is even, the assignment of screen angles, in accordance with a preferred embodiment of the present invention, as described above, assures that colorants belonging to the same color region are printed with screen angles that are 30° apart. If N-1 is odd however, the colorants numbered 1 and N-1, which belong to the same color region, are assigned the same screen angle. In order to prevent this from occurring the Y colorant is preferably assigned a screen angle that is different from the first and second screen angles and from 45°. The remaining N-2 colorants are numbered and assigned screen angles in accordance with the procedure described above, with Y excluded. Preferably, Y is assigned a screen angle of 90° or 0°.

In one N-colorant set, in accordance with a preferred embodiment of the present invention N is equal to 6 and the colorants used, are C, M, Y, K plus Violet (V) and Orange (O). Black is preferably printed with a screen angle of 45°. The colorants O, M, V and C are alternately assigned screen angles of 15° and 75° starting with O which is assigned a screen angle of either 15° or 75°. Since there are an odd number of non-black colorants, Y is preferably assigned a screen angle different from 15° and 75°. If Y were assigned a screen angle of 15° or 75° then Y would be printed with the same screen angle that either C or O is printed. Y however belongs to the color region that C belongs to and the color region that O belong to. Even though Y is a weak colorant and does not generally generate moiré patterns as readily as the other colorants, it is advantageous to assign Y a screen angle that is different from the screen angles of the colorants with which it is printed. Y therefore is preferably assigned a screen angle of 0° or 90°.

The six colorant set using C, M, Y, K plus Violet (V) and Orange (O), (hereafter referred to as CMYK+VO) appears to provide one third more of the most frequently requested printing hues than the standard CMYK colorant set.

There is therefor provided in accordance with a preferred embodiment of the present invention, process for color printing an image with angled half tone screens and a colorant set that includes Cyan, Magenta, Yellow and Black colorants and at least one other colorant comprising: choosing the at least one other colorant so that one of the at least one other colorant is a colorant having a hue angle intermediate the hue angles of Cyan and Magenta; assigning a screen angle to each of the colorants in the colorant set; providing an angled half tone screen for each of the colorants of the colorant set responsive to a color separation of the image; and using the angled halftone screens to produce a color printing of the image.

In some preferred embodiments of the present invention the number of colorants in the colorant set is odd, and assigning a screen angle to each of the colorants of the colorant set comprises assigning black a first screen angle, assigning one half of the non-black colorants a second screen angle and one half of the non-black colorants a third screen angle, wherein the first, second and third screen angles are different and wherein non-black colorants having adjacent hue angles are assigned different screen angles.

In other preferred embodiments of the present invention, the number of colorants in the colorant set is even and assigning a screen angle to each of the colorants of the colorant set comprises assigning black a first screen angle, assigning one half of the colorants that are neither black or yellow a second screen angle and one half of the colorants that are neither black or yellow a third screen angle, wherein yellow is assigned a fourth screen angle, wherein the first, second, third and fourth screen angles are different and wherein non-black colorants having adjacent hue angles are assigned different screen angles. Preferably choosing the at least one other colorant comprises choosing two colorants. Additionally or alternatively, the difference between the fourth screen angle and the first screen angle is preferably 45°.

Additionally, or alternatively the angle between the first screen angle and either of the second and third screen angles is preferably substantially 30° and the angle between the second and the third screen angles is preferably substantially 30°. Preferably, the first screen angle is 45°, one of the second and third screen angles is 15° and the other of the second and third screen angles is 75°.

Additionally or alternatively, choosing the at least one other colorant so that one of the at least one other colorant is a colorant having a hue angle intermediate the hue angles of Cyan and Magenta preferably comprises choosing a colorant substantially exterior to the gamut of hues provided by the Cyan, Magenta, Yellow and Black colorants.

In some preferred embodiments of the present invention, choosing the at least one other colorant so that one of the at least one other colorant is a colorant having a hue angle intermediate the hue angles of Cyan and Magenta preferably comprises choosing Violet.

In other preferred embodiments of the present invention, choosing the at least one other colorant so that one of the at least one other colorant is a colorant having a hue angle intermediate the hue angles of Cyan and Magenta comprises choosing Purple.

In yet other preferred embodiments of the present invention, choosing the at least one other colorant comprises choosing at least two other colorants and wherein one of the at least two other colorants is Orange.

Additionally or alternatively Cyan and Magenta preferably have the same screen angles.

There is further provided an image produced using a process in accordance with a preferred embodiment of the present invention.

There is also provided a colorant set for color printing with angled half tone screens comprising: at least five colorants including Cyan, Magenta, Yellow and Black colorants; and at least one colorant having a hue angle intermediate the hue angles of Cyan and Magenta.

In some preferred embodiments of the present invention, the number of the at least five colorants is odd, wherein the black colorant has a first screen angle, wherein one half of the non-black colorants have a second screen angle and one half of the non-black colorants have a third screen angle, wherein the first, second and third screen angles are different and wherein non-black colorants having adjacent hue angles have different screen angles.

In other preferred embodiments of the present invention, the number of the at least five colorants is even, wherein the black colorant has a first screen angle, wherein one half of the colorants that are neither black or yellow have a second screen angle and one half of the colorants that are neither black or yellow have a third screen angle, wherein yellow has a fourth screen angle, wherein the first, second, third and fourth screen angles are different and wherein non-black colorants having adjacent hue angles have different screen angles. Preferably, the number of the at least five colorants is six.

Alternatively or additionally, the difference between the fourth screen angle and the first screen angle is preferably 45°.

Alternatively or additionally the angle between the first screen angle and either of the second and third screen angles is preferably substantially 30° and the angle between the second and the third screen angles is preferably substantially 30°. Preferably, the first screen angle is 45°, one of the second and third screen angles is 15° and the other of the second and third screen angles is 75°.

Alternatively or additionally the at least one colorant having a hue angle intermediate the hue angles of Cyan and Magenta is a colorant preferably substantially exterior to the gamut of hues provided by the Cyan, Magenta, Yellow and Black colorants.

In some preferred embodiments of the present invention, the at least one colorant having a hue angle intermediate the hue angles of Cyan and Magenta comprises one colorant.

In some preferred embodiments of the present invention, at least one of the at least one colorant having a hue angle intermediate the hue angles of Cyan and Magenta is Violet.

In other preferred embodiments of the present invention, at least one of the at least one colorant having a hue angle intermediate the hue angles of Cyan and Magenta is Purple.

In some preferred embodiments of the present inventions comprising at least 6 colorants one of the colorants is preferably Orange.

Additionally or alternatively Cyan and Magenta preferably have the same screen angles.

BRIEF DESCRIPTION OF FIGURES

The invention will be more clearly understood by reference to the following description of preferred embodiments thereof in conjunction with the figures, wherein identical structures, elements or parts that appear in more than one figure are labeled with the same numeral in all the figures in which they appear, and in which.

DETAILED DESCRIPTION OF PREFERRED EMBODIMENTS

Figure 1:
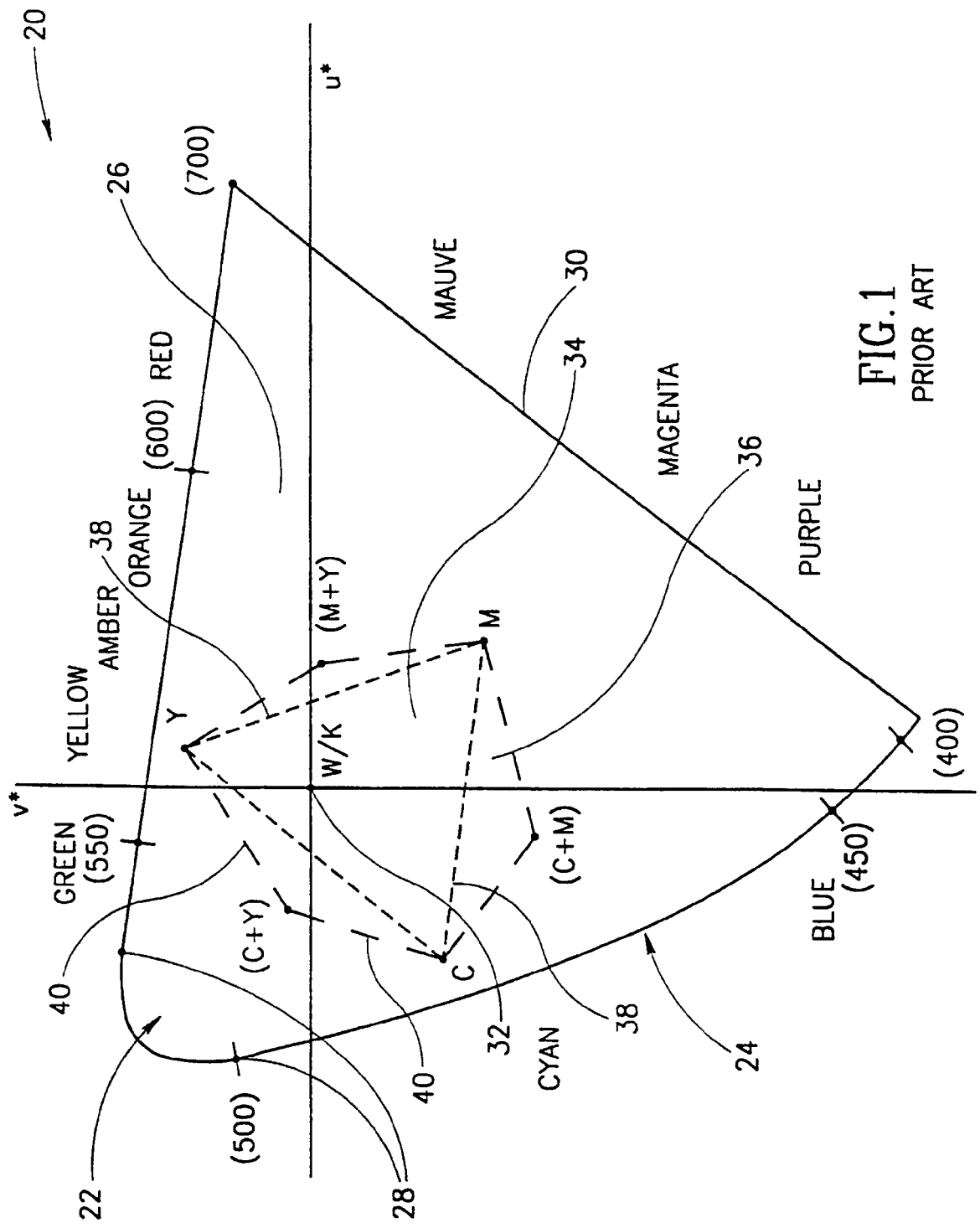
FIG. 1 shows schematically a chromaticity diagram where hues are mapped as a function of arbitrary units of commonly used color variables u* and v*, showing the human visual color gamut and portions thereof included in a restricted and full CMYK gamut.
Figure 2:
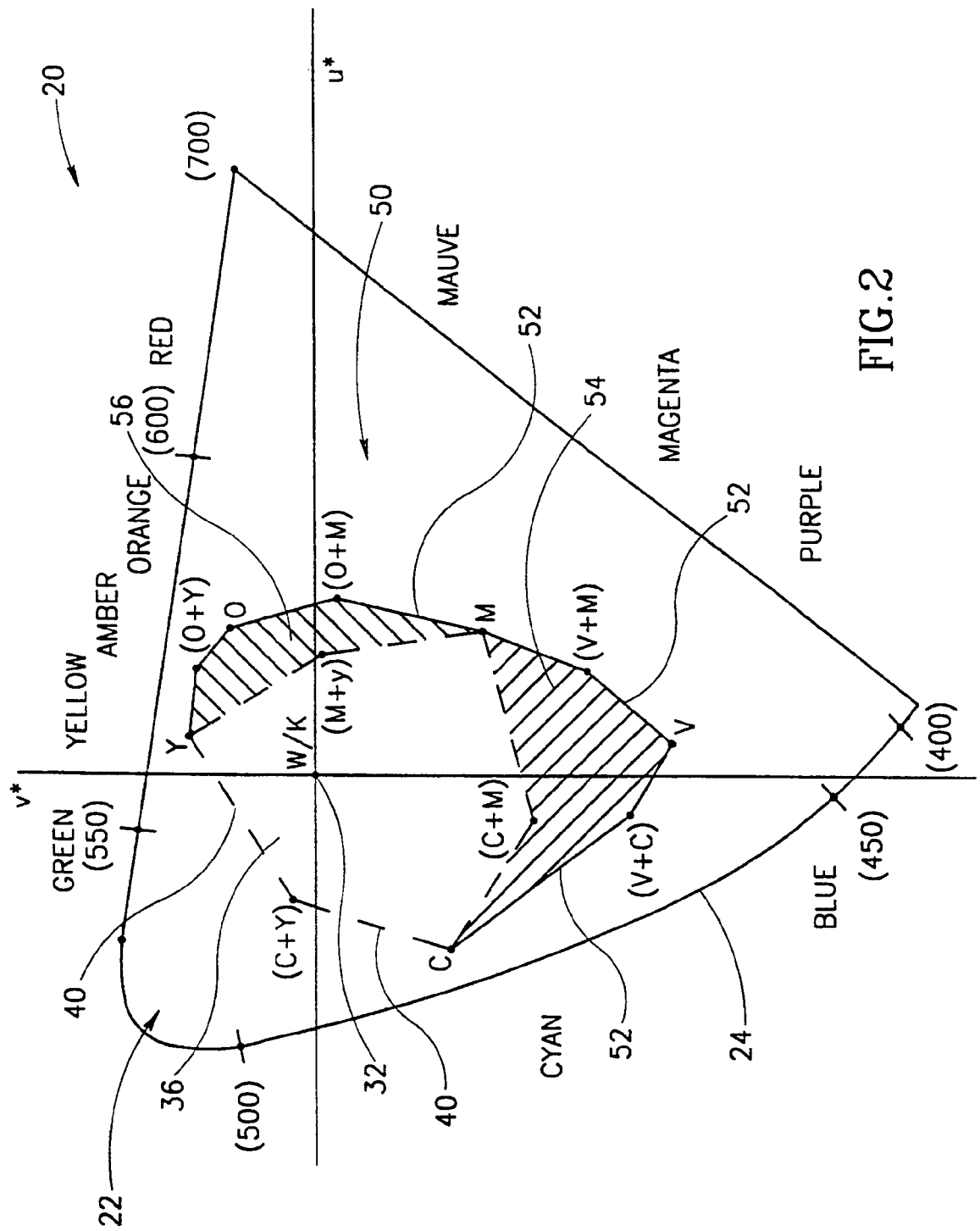
FIG. 2 shows schematically the full CMYK gamut shown in FIG. 1 and a six colorant CMYK+VO gamut resulting from a set of six colorants comprising C, M, Y, K, Violet (V) and Orange (O), in accordance with a preferred embodiment of the present invention.

FIG. 2 shows schematically, full CMYK gamut 36 shown in FIG. 1 and a six colorant CMYK+VO gamut 50 resulting from a set of six colorants comprising C, M, Y, K, Violet (V) and Orange (O), in accordance with a preferred embodiment of the present invention.

Points labeled V and O in chromaticity diagram 20 represent the hues of colorants V and O respectively that are added to the standard C, M, Y and K colorants to provide the CMYK+VO colorant set, in accordance with a preferred embodiment of the present invention. CMYK+VO gamut 50 is equal to the portion of visual gamut 22 enclosed within the polygon formed by solid lines 52 that connect points C→(C+V)→V→(V+M)→M→(M+O)→O→(+Y)→Y and long dash lines 40 that connect points Y→(C+Y)→C. Points (C+V), (V+M), (M+O), and (O+Y) represent hues created by mixing equal parts of each of the colorants in the respective parenthesis. These points are not located on the lines connecting C and V, V and M. M and O, and O and Y for the same reasons that hue (C+Y) is not located on the line connecting C and Y in extended CMYK gamut 36 shown in FIG. 1. CMYK+VO gamut 50 includes full CMYK gamut 36 plus gamut area 54 and gamut area 56 that are shown with a hatched pattern. As a result of the use of V as a colorant CMYK+VO gamut 50 extends beyond CMYK gamut 36 and includes hues for which there is substantial demand.

Figure 3:
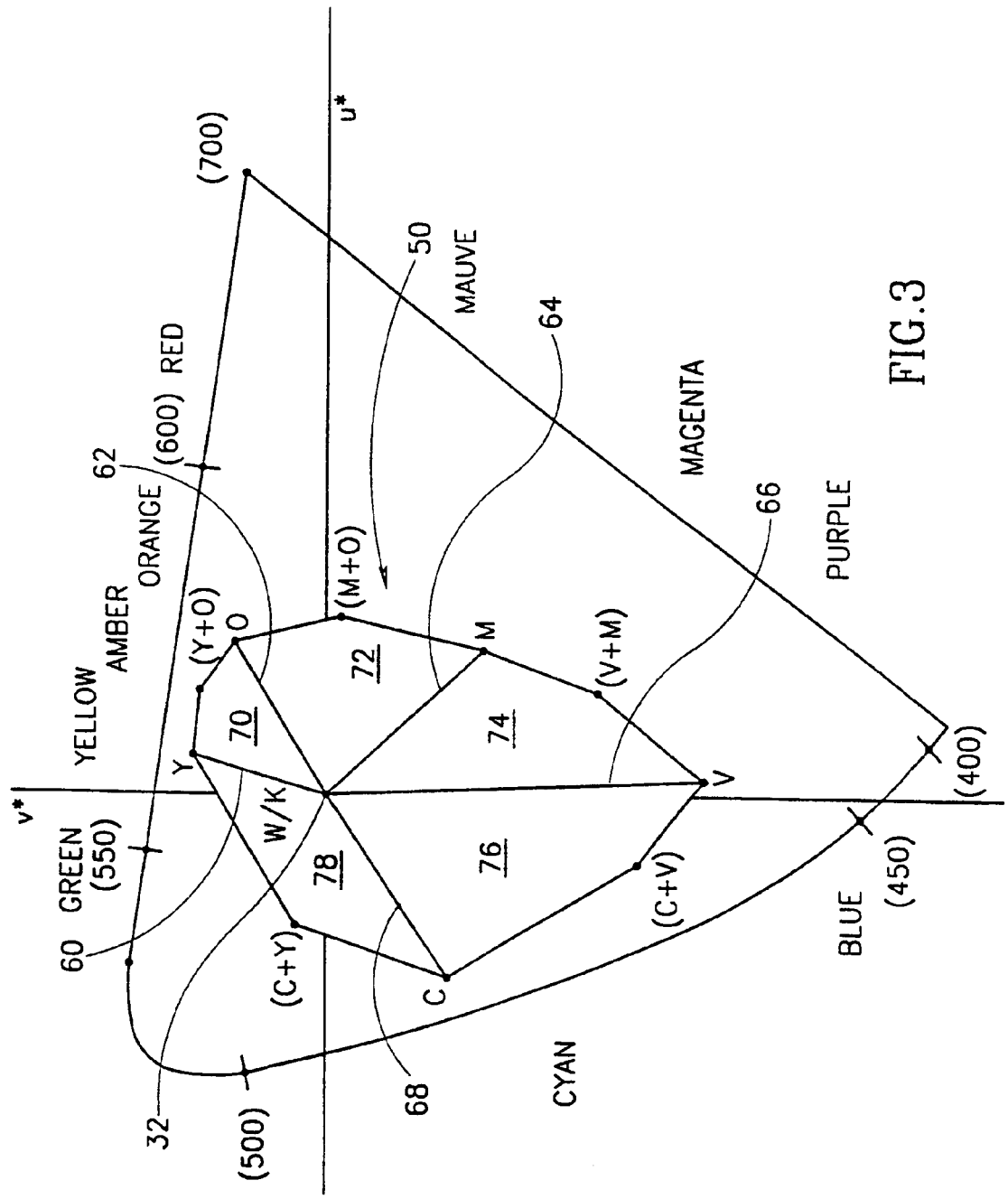
FIG. 3 shows the CMYK+VO gamut shown in FIG. 2 and printing angles assigned to each of the colorants C, M, Y, K, V and O of the CMYK+VO colorant set, in accordance with a preferred embodiment of the present invention.

FIG. 3 shows the screen angles in parenthesis assigned to each of the colorants C, M, Y, K, V and O of CMYK+VO, in accordance with a preferred embodiment of the present invention. Black (K) is preferably assigned a screen angle of 45°, which is shown next to point 32 (labeled W/K). The other colorants, starting with O and moving clockwise around the perimeter of CMYK+VO gamut 50, are alternately assigned a screen angle of preferably 15° or 75° except for Y, which is assigned a screen angle of preferably either 0° or 90°. Since there are an odd number of non-black colorants, if Y were assigned a screen angle using the alternating 15°–75° procedure used to assign screen angles to the other colorants, Y would be assigned the same screen angle as O. To prevent this, and mitigate any moiré patterns that might occur, Y is preferably assigned a screen angle different from the other colorants. In FIG. 4 Y is shown with a screen angle of 90° and O is shown assigned a screen angle of 75°. O could just as well have been assigned a screen angle of 15°, and Y assigned a screen angle of 0°, in accordance with a preferred embodiment of the present invention. The choices shown are by way of example only. It should be understood that screen angle pairs other than 15° and 75° can be used for the screen angles that are assigned to the colorants of the CMYK+VO colorant set, in accordance with a preferred embodiment of the present invention, and this will be understood by persons of the art.

In FIG. 3 the lines 60, 62, 64, 66 and 68 connecting the point 32 (the "white/black" point) and the points representing the colorants O, M, V, C and Y are the lines that define the respective hue angles of these colorants. Lines 60, 62, 64, 66 and 68 together with the lines connecting the colorants divide CMYK+VO gamut 50 into five color regions 70, 72, 74, 76 and 78. A color represented by a point in any one of color regions 70, 72, 74, 76 and 78 is produced by using only the three colorants at the vertices, the colorant vertices, located at end points of the lines defining the color region 70, 72, 74, 76 or 78 in which the point is located.

The present invention has been described using a non-limiting detailed description of a preferred embodiment thereof. Variations of the embodiment described will occur to persons of the art. The detailed description is provided by way of example and is not meant to limit the scope of the invention, which is limited only by the following claims:

What is claimed is:

1. A process for color printing an image with angled half tone screens and a colorant set that includes Cyan, Magenta, Yellow and Black colorants and at least one other colorant comprising:

choosing the at least one other colorant so that one of the at least one other colorant is a colorant having a hue angle intermediate the hue angles of Cyan and Magenta;

assigning a screen angle to each of the colorants in the colorant set:

providing an angled half tone screen for each of the colorants of the colorant set responsive to a color separation of the image; and using the angled half tone screens to produce a color printing of the Image, wherein the number of colorants in the colorant set is odd and assigning a screen angle to each of the colorants of the colorant set comprises assigning black a first screen angle, assigning one half of said non-black colorants a second screen angle and one half of said non-black colorants a third screen angle, wherein said first, second and third screen angles are different and wherein non-black colorants having adjacent hue angles are assigned different screen angles.

2. A process for color printing an image with angled half tone screens and a colorant set that includes Cyan, Magenta, Yellow and Black colorants and at least one other colorant comprising:

choosing the at least one other colorant so that one of the at least one other colorant is a colorant having a hue angle intermediate the hue angles of Cyan and Magenta;

assigning a screen angle to each of the colorants in the colorant set;

providing an angled half tone screen for each of the colorants of the colorant set responsive to a color separation of the image; and using the angled halftone screens to produce a color printing of the image, wherein the number of colorants in the colorant set is even and assigning a screen angle to each of the colorants of the colorant set comprises assigning black a first screen angle, assigning one half of said colorants that are neither black or yellow a second screen angle and one half of said colorants that are neither black or yellow a third screen angle, wherein yellow is assigned a fourth screen angle, wherein said first, second, third and fourth screen angles are different and wherein non-black colorants having adjacent hue angles are assigned different screen angles.

3. A process according to claim 1 wherein the angle between said first screen angle and either of said second and third screen angles is substantially 30° and the angle between said second and said third screen angles is substantially 30°.

4. A process according to claim 3 wherein said first screen angle is 45°, one of said second and third screen angles is 15° and the other of said second and third screen angles is 75°.

5. A process according to claim 2 wherein choosing the at least one other colorant comprises choosing two colorants.

6. A process according to claim 2 wherein the difference between said fourth screen angle and said first screen angle is 45°.

7. A process according to any of the previous claims wherein choosing the at least one other colorant so that one of the at least one other colorant is a colorant having a hue angle intermediate the hues angles of Cyan and Magenta comprises choosing a colorant substantially exterior to the gamut of hues provided by said Cyan, Magenta, Yellow and Black colorants.

8. A process according to any of claims 1–4 wherein choosing the at least one other colorant so that one of the at least one other colorant is a colorant having a hue angle intermediate the hue angles of Cyan and Magenta comprises choosing violet.

9. A process according to any of claims 1–4 wherein choosing the at least one other colorant comprises choosing at least two other colorants and wherein one of the at least two other colorants is Orange.

10. A process according to any of claims 1–4 wherein Cyan and Magenta have the same screen angles.

11. A color printing of an image produced using a process according to any of claims 1–4.

12. A colorant set for color printing with angled half tone screens comprising:
at least five colorants including Cyan, Magenta, Yellow and Black colorants; and at least one colorant have a hue angle intermediate the hue angles of Cyan and Magenta,
wherein the number of the at least five colorants is odd wherein said black colorant has a first screen angle, wherein one half of said non-black colorants have a second screen angle and one half of said non-black colorants have a third screen angle, wherein said first, second and third screen angles are different and wherein non-black colorants having adjacent hue angles have different screen angles.

13. A colorant set for color printing with angled halftone screens comprising;
at least five colorants including Cyan, Magenta, Yellow and Black colorants; and at least one colorant have a hue angle intermediate the hue angles of Cyan and Magenta,
wherein the number of the at least five colorants is even, wherein said black colorant has a first screen angle, wherein one half of said colorants that are neither black or yellow have a second screen angle and one half of said colorants that are neither black or yellow have a third screen angle, wherein yellow has a fourth screen angle, wherein said first, second, third and fourth screen angles are different and wherein non-black colorants having adjacent hue angles have different screen angles.

14. A colorant set according to claim 12 wherein the angle between said first screen angle and either of said second and third screen angles is substantially 30° and the angle between said second and said third screen angles is substantially 30°.

15. A colorant according to claim 14 wherein said first screen angle is 45°, one of said second and third screen angles is 150 and the other said second and third screen angles is 75°.

16. A colorant set according to claim 13 wherein the number of the at least five colorants is six.

17. A colorant set according to claim 13 wherein the difference between said fourth screen angle and said first screen angle is 45°.

18. A colorant set according to any of claims 12–15 wherein the at least one colorant having a hue angle intermediate the hue angles of Cyan and Magenta is a colorant substantially exterior to the gamut of hues provided by said Cyan, Magenta, Yellow and Black colorants.

19. A colorant set according to any of claims 12–15 wherein said at least one colorant having a hue angle intermediate the hue angles of Cyan and Magenta comprises one colorant.

20. A colorant set according to any of claims 12–15 wherein at least one of said at least one colorant having a hue angle intermediate the hue angles of Cyan and Magenta is Violet.

21. A colorant set according to any of claims 12–15 wherein at least one of said at least one colorant having a hue angle intermediate the hue angles of Cyan and Magenta is Purple.

22. A colorant set according to any of claims 12–15 comprising at least 6 colorants wherein one of the colorants is Orange.

23. A colorant set according to any of claims 12–15 wherein Cyan and Magenta have the same screen angles.

24. A process for color printing an image with angled halftone screens and a colorant set that includes Cyan, Magenta, Yellow and Black colorants and at least one other colorant comprising:
choosing the at least one other colorant so that one of the at least one other colorant is a colorant having a hue angle intermediate the hue angles of Cyan and Magenta;
assigning a screen angle to each of the colorants in the colorant set;
providing an angled half tone screen for each of the colorants of the colorant set responsive to a color separation of the image; and
using the angled half tone screens to produce a color printing of the Image,
wherein choosing the at least one other colorant so that one of the at least one other colorant is a colorant having a hue angle intermediate the hues angles of Cyan and Magenta comprises choosing a colorant substantially exterior to the gamut of hues provided by said Cyan, Magenta, Yellow and Black colorants.

25. A process for color printing an image with angled half tone screens and a colorant set that includes Cyan, Magenta, Yellow and Black colorants and at least one other colorant comprising:

choosing the at least one other colorant so that one of the at least one other colorant is a colorant having a hue angle intermediate the hue angles of Cyan and Magenta;

assigning a screen angle to each of the colorants in the colorant set;

providing an angled half tone screen for each of the colorants of the colorant set responsive to a color separation of the image; and using the angled halftone screens to produce a color printing of the image, wherein choosing the at least one other colorant so that one of the at least one other colorant is a colorant having a hue angle intermediate the hue angles of Cyan and Magenta comprises choosing violet.

26. A colorant set for color printing with angled half tone screens comprising:

at least five colorants including Cyan, Magenta, Yellow and Black colorants; and at least one colorant have a hue angle intermediate the hue angles of Cyan and Magenta, wherein the at least one colorant having a hue angle intermediate the hue angles of Cyan and Magenta is a colorant substantially exterior to the gamut of hues provided by said Cyan, Magenta, Yellow and Black colorants.

27. A process for color printing an image with angled halftone screens and a colorant set that includes Cyan, Magenta, Yellow and Black colorants and at least one other colorant comprising:

choosing the at least one other colorant so that one of the at least one other colorant is a colorant having a hue angle intermediate the hue angles of Cyan and Magenta;

assigning a screen angle to each of the colorants in the colorant set;

providing an angled half tone screen for each of the colorants of the colorant set responsive to a color separation of the image; and using the angled halftone screens to produce a color printing of the image, wherein cyan and magenta have a same screen angle.

* * * * *